United States Patent [19]

Reimer

[11] Patent Number: 4,550,362
[45] Date of Patent: Oct. 29, 1985

[54] BOARD POSITIONING ARRANGEMENT

[75] Inventor: William A. Reimer, Wheaton, Ill.

[73] Assignee: GTE Automatic Electric Inc., Northlake, Ill.

[21] Appl. No.: 443,772

[22] Filed: Nov. 22, 1982

[51] Int. Cl.⁴ .............................................. H05K 7/14
[52] U.S. Cl. ..................................... 361/415; 241/41; 339/91 R; 361/413
[58] Field of Search ................. 211/41, 45; 248/309.1, 248/452–454; 339/17 LM, 17 M, 61 M, 61 R, 66 T, 65, 91 R, 94 M, 186 T, 186 M, 186 R, 17 LC; 361/395, 399, 412, 413, 415, 419

[56] References Cited

U.S. PATENT DOCUMENTS

| 2,946,033 | 7/1960 | Wirth | 339/17 LM |
| 2,951,185 | 8/1960 | Buck | 361/412 |
| 3,644,868 | 2/1972 | Nevala | 339/66 M |
| 3,829,741 | 8/1974 | Athey | 361/412 |
| 3,853,379 | 12/1974 | Goodman et al. | 361/415 |
| 4,046,443 | 9/1977 | Champagne | 339/66 M |
| 4,109,300 | 8/1978 | Reimer | 361/415 |
| 4,198,024 | 4/1980 | Cavanna | 361/399 |
| 4,434,537 | 3/1984 | Bean et al. | 361/399 |

FOREIGN PATENT DOCUMENTS

| 2516746 | 4/1975 | Fed. Rep. of Germany | 361/399 |
| 2800307 | 7/1978 | Fed. Rep. of Germany | 339/17 LC |
| 0909732 | 2/1982 | U.S.S.R. | 339/186 M |

Primary Examiner—A. D. Pellinen
Assistant Examiner—Gregory D. Thompson
Attorney, Agent, or Firm—Robert J. Black

[57] ABSTRACT

An arrangement for positioning a printed wiring board relative to a rigid backplane without the need of support for the printed wiring board from below. Connector pins extend from the backplane and engage connector sockets mounted on the printed wiring board to support the printed wiring board. The printed wiring board is further prevented from falling away from the backplane by a retaining guide assembly which is mounted to the backplane and which engages the front edge of the printed wiring board at its upper end.

4 Claims, 3 Drawing Figures

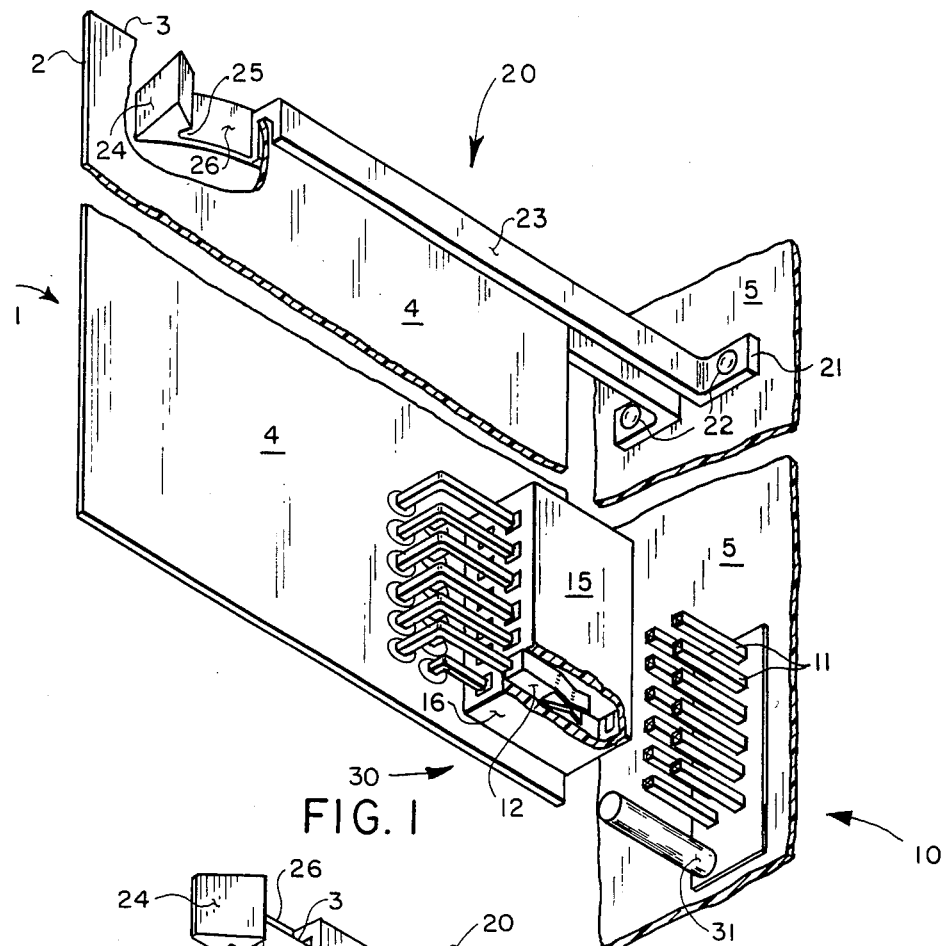
FIG. 1
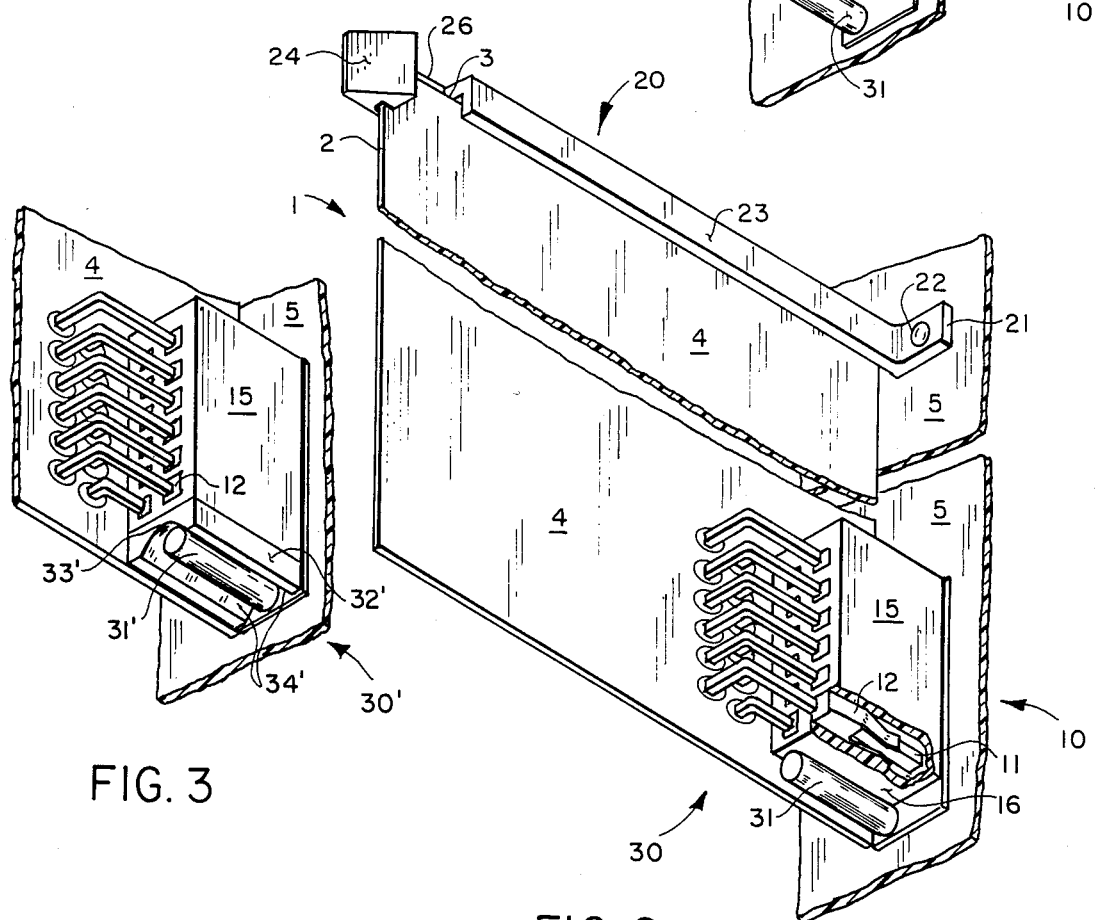
FIG. 3
FIG. 2

BOARD POSITIONING ARRANGEMENT

BACKGROUND OF THE INVENTION

The present invention relates to printed wiring card positioning arrangements and, more particularly, to an arrangement for positioning a printed wiring board not relying on support of the board from below.

Printed wiring board positioning arrangements are well known to those skilled in the art. One very common type is taught in U.S. Pat. No. 3,216,580 issued Nov. 9, 1965, to F. V. Fricker, Jr. This patent provides a positioning device for retaining cards which includes base and upper members connected by a flexible segment. The base and upper members include card admitting grooves and are positioned such that the lower end of the upper member's groove is out of alignment with the lower member's groove. Such devices rely on both card vertical edges to position the card and the card's bottom edge to support the card.

U.S. Pat. No. 4,089,042 issued May 9, 1978, to R. B. Torburn, teaches an apparatus for positioning hybrid substrates in a vertical orientation including a vertically oriented flat body portion located adjacent the substrate to be positioned. The body portion is held in contact with a horizontal mounting plane by means of a first peg extending from the body portion through the horizontal plane. Protrusions extend over the upper edge of and below the lower edge of the held substrate to position the substrate relative to the mounting plane. Such an arrangement has the disadvantage of being suitable for use only with substrates mounted upon a horizontal surface.

U.S. Pat. No. 4,198,024 issued Apr. 15, 1980, to Cavanna, teaches a unitary retention arm for printed circuit boards engaged in card connectors attached to vertically oriented base members. The retention arm is mounted to the base and engages the printed circuit card edge opposite the connector to hold the card seated within the connector. Such an arrangement can permit lateral movement of the printed circuit board relative to the connector thus allowing contact misalignment, shorting of adjacent contacts, and opening of the contact connection to occur.

SUMMARY OF THE INVENTION

A printed wiring board positioning arrangement is provided in accordance with the present invention which avoids the disadvantages and shortcomings of the above cited art and includes an arrangement for positioning a printed wiring board relative to a rigid vertical backplane supported by connector pins extending from the backplane. A connector body, having contacts in the form of receptacles, is mounted to the printed wiring board and engages the backplane mounted pins to provide board support. A retainer attached to the backplane near the top edge of the board engages the front edge of the board near its upper front corner to prevent the printed wiring board from falling away from the backplane. Angular movement of the board in the horizontal plane is prevented by a board guide included in the board retainer which engages the top edge of the printed wiring board. An alignment pin extends perpendicularly from the backplane adjacent and parallel to the connector pins, and engages a printed wiring board mounted alignment guide to align the connector board terminals with the backplane mounted pins and thus permit their engagement when the board is positioned and connected according to the present invention.

BRIEF DESCRIPTION OF THE DRAWING

The various objects, features, and advantages of a printed wiring board positioning arrangement in accordance with the present invention will be apparent from the following description taken in conjunction with the accompanying drawing in which:

FIG. 1 is a perspective view of a printed wiring board partially positioned in accordance with the present invention;

FIG. 2 is a perspective view of a printed wiring board fully positioned in accordance with the present invention; and FIG. 3 is a perspective view of a variation of the alignment means embodied in the present invention.

DESCRIPTION OF THE PREFERRED EMBODIMENT

Referring now to FIGS. 1 and 2 there is shown the printed wiring board positioning arrangement of the present invention. Printed wiring board 1 having front edge 2, top edge 3, and side surface 4 is positioned adjacent rigid backplane 5 and maintained in that position, as hereinafter described. Rigid backplane 5 is vertically oriented and serves as a mounting base for the several component parts of the present invention. In this regard, a plurality of electrical connector pins 11 extend perpendicularly from the backplane 5. A corresponding plurality of connector pin receptacles 12 are retained within an insulative connector body 15 which is attached to the printed wiring board surface 4. The connector receptacles 12 engage the connector pins 11 to form a support 10 for the printed wiring board 1 and to provide paths for electrical signals to and from the printed wiring board.

Retainer 20 includes rigid base portion 21 attached to the backplane 5 by means of fasteners 22. The fasteners 22 may be any of the types generally known in the art, for example, screws or eyelet rivets. Alternatively, adhesive bonding techniques may be used to attach the base portion 21 to the backplane 5 in place of the fasteners 22. A printed wiring board guide 23 extends from the base portion 21 in a direction perpendicular to the backplane 5. The guide 23 has a generally inverted U-shaped cross-section and is sized to enclose the top edge 3 of the printed wiring board 1 and, thus, prevent angular movement of the board in the horizontal plane. The retainer 20 further includes a latch 24 having a generally triangularly shaped cross-section. The latch 24 is vertically oriented and includes an elongated vertical channel 25. The latch 24 is connected to the guide 23 by flexible section 26. The channel 25 of the latch 24 engages the front edge 2 of the printed wiring board 1 to prevent the board 1 from falling away from the backplane 5 under the force of gravity, as is most clearly shown in FIG. 2.

A connector aligner 30 is provided to assist in mating the connector sockets 12 with the connector pins 11 and includes alignment pin 31 extending perpendicularly from the backplane 5. The alignment pin 31 is positioned relative to the connector pins 11 so as to place it in contact with the printed wiring board surface 4 and a lower surface 16 of the connector body 15 when the connector sockets 12 are engaged with the connector pins 11. The alignment pin 31 is preferably longer than the connector pins 11 to permit alignment of the connector receptacles 12 of the printed wiring board 1 relative to the connector pins 11 before they are engaged.

Referring to FIG. 3, there is shown at 30' a variation of the connector aligner 30 shown in FIG. 2. The connector aligner 30', as shown in FIG. 3, includes an aligner guide 32' attached to the printed wiring board 1 below the connector body 15. The aligner guide 32' includes engaging surface 33' shaped to closely fit the upper surface of the associated alignment pin 31'. A pair of alignment pin locating surfaces 34' meet the engaging surface 33' and extend downwardly diverging to assist in locating the alignment pin 31' adjacent to the engaging surface 33' when the printed wiring board 1 is oriented for positioning adjacent to the backplane 5. The aligner guide 32' prevents horizontal movement of the bottom of the printed wiring board 1 to prevent misalignment of the connector receptacles 12 and the connector pins 11 as the printed wiring board is being slid into position adjacent to the backplane 5.

The printed wiring board 1 may alternatively be supported from the backplane 5 by the connector aligner 30 in lieu of support via the connector receptacles 12 engaged with the connector pins 11. In this regard and considering the embodiment shown in FIG. 2, the alignment pin 31 will engage the printed wiring board surface 4 to align, and the lower surface 16 of the connector body 15 to align and support the printed wiring board 1 from the backplane 5. If, on the other hand, the embodiment shown in FIG. 3 is considered, the alignment pin 31' will engage aligner guide 32' via engaging surface 33' to align and support the printed wiring board 1 from the backplane 5.

The printed wiring board 1 as shown in the drawing is positioned relative to the backplane 5, according to the present invention, by causing the flexible section 26 to yield thereby displacing the latch 24 to permit placing the upper surface 3 of the printed wiring board 1 within the board guide 23, and then placing the printed wiring board surface 4 and the lower surface 16 of the connector body 15 (or the engaging surface 33' of the aligner guide 32' in FIG. 3) in contact with the alignment pin 31 (or 31'). These actions will serve to align the connector receptacles 12 with the connector pins 11, thereby facilitating their subsequent engagement. The printed wiring board 1 is then slid toward the backplane 5 to engage the connector sockets 12 with the connector pins 11 and position the printed wiring board 1 adjacent to the backplane 5. As the printed wiring board 1 is slid into position, the latch 24 of the retainer 20 will snap around the front edge 2 of the printed wiring board 1 under force of the flexible member 26 thus engaging the channel 25 around the front edge 2 of the printed wiring board 1.

The printed circuit board 1 is removed from its position relative to the backplane 5 by bending the latch 24 horizontally away from the printed wiring board 1 to disengage the channel 25 from the front edge 22. The printed wiring board 1 is then slid horizontally away from the backplane 5 to disengage the connector sockets 12 from the connector pins 11, the alignment pin 31 from the printed wiring board surface 4 and the lower surface 16 of the connector body 15, and the top edge 3 from the printed wiring board guide 23.

The present invention has been described with reference to a specific embodiment thereof for the purpose of illustrating the manner in which the invention may be used to advantage. It will be appreciated by those skilled in the art that numerous modifications of the present invention can be made without departing from the spirit of the invention which shall be limited only by the scope of the claims appended hereto.

What is claimed is:

1. A vertical planar assembly positioning arrangement including an upper edge and a front edge, said arrangement comprising:
   a vertically oriented rigid backplane;
   a retainer of unitary construction including
      a rigid base portion mounted to said backplane proximate to said planar assembly upper edge,
      a rigid guide portion connected to said rigid base portion and extending in a direction perpendicularly from said backplane and engaging said planar assembly upper edge,
      a latch portion including a vertical groove in a side thereof facing and adapted to engage said front edge of said planar assembly, and
      a flexible section connecting said latch portion to said guide portion, said flexible section yielding to facilitate displacement of said latch portion to thus permit engagement of said planar assembly first edge within said guide portion, and in response to passage of said planar assembly past said latch portion, said flexible section automatically restoring to engage said vertical groove with said planar assembly front edge; and
   support means comprising
      a plurality of connector pins attached to and extending perpendicularly from said backplane, and
      a connector body including a corresponding plurality of connector receptacles engaging said pins and attached to said planar assembly to support said planar assembly and provide paths for electrical signals to and from said planar assembly.

2. A planar assembly positioning arrangement as claimed in claim 1, wherein: said connector body is constructed of insulating material attached to said planar assembly.

3. A planar assembly positioned arrangement as claimed in claim 1, wherein: said support means includes an elongated alignment pin extending perpendicularly a greater distance from said backplane than said plurality of connector pins, and a pin guide engaging said elongated alignment pin to locate said planar assembly in relation to said backplane prior to said plurality of connector receptacles engaging said plurality of connector pins.

4. A planar assembly positioning arrangement as claimed in claim 3, wherein: said pin guide is comprised of the area defined by an outer surface of said planar assembly adjacent said connector body and a lower surface of said connector body, said pin guide engaging said elongated alignment pin to align said planar assembly in relation to said backplane.

* * * * *